(12) United States Patent
Terada et al.

(10) Patent No.: US 8,493,800 B2
(45) Date of Patent: Jul. 23, 2013

(54) THREE DIMENSIONAL SEMICONDUCTOR STORAGE DEVICE HAVING WRITE DRIVERS UNDER A THREE DIMENSIONAL MEMORY CELL ARRAY

(75) Inventors: Yuri Terada, Kanagawa (JP); Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 13/021,208

(22) Filed: Feb. 4, 2011

(65) Prior Publication Data

US 2011/0199838 A1    Aug. 18, 2011

(30) Foreign Application Priority Data

Feb. 5, 2010   (JP) .................................. 2010-024243

(51) Int. Cl.
*G11C 7/00*   (2006.01)

(52) U.S. Cl.
USPC ................. 365/189.11; 365/148; 365/189.07; 365/189.09; 365/230.06

(58) Field of Classification Search
USPC .................. 365/148, 189.07, 189.09, 189.11, 365/230.06, 233.1
See application file for complete search history.

(56) References Cited

U.S. PATENT DOCUMENTS

| 2008/0253182 A1* | 10/2008 | Kim et al. ................. 365/185.03 |
| 2010/0046267 A1* | 2/2010 | Yan et al. ........................ 365/51 |
| 2010/0091541 A1 | 4/2010 | Park et al. |
| 2010/0232208 A1* | 9/2010 | Maejima et al. .............. 365/148 |

FOREIGN PATENT DOCUMENTS

| JP | 2006-514440 | 4/2006 |
| JP | 2006-133165 | 5/2006 |
| JP | 2009-157982 | 7/2009 |
| JP | 2009-163867 | 7/2009 |
| JP | 2010-92580 A | 4/2010 |
| WO | WO 2004/ 090984 | 10/2004 |

OTHER PUBLICATIONS

Mark Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.
Office Action issued Feb. 19, 2013 in Japanese Patent Application No. 2010-024243 with English language translation.

* cited by examiner

*Primary Examiner* — Hoai V Ho
(74) *Attorney, Agent, or Firm* — Oblon, Spivak, McClelland, Maier & Neustadt, L.L.P.

(57) ABSTRACT

According to one embodiment, a semiconductor storage device includes a three-dimensional memory cell array, write drivers, and a program voltage control circuit. In the three-dimensional memory cell array, memory cells are three-dimensionally arranged. The write drivers are arranged to be distributed under the three-dimensional memory cell array and apply a program voltage to the memory cells during writing in the memory cells. The program voltage control circuit is arranged around the three-dimensional memory cell array and performs control for making the write drivers to generate the program voltage.

10 Claims, 5 Drawing Sheets

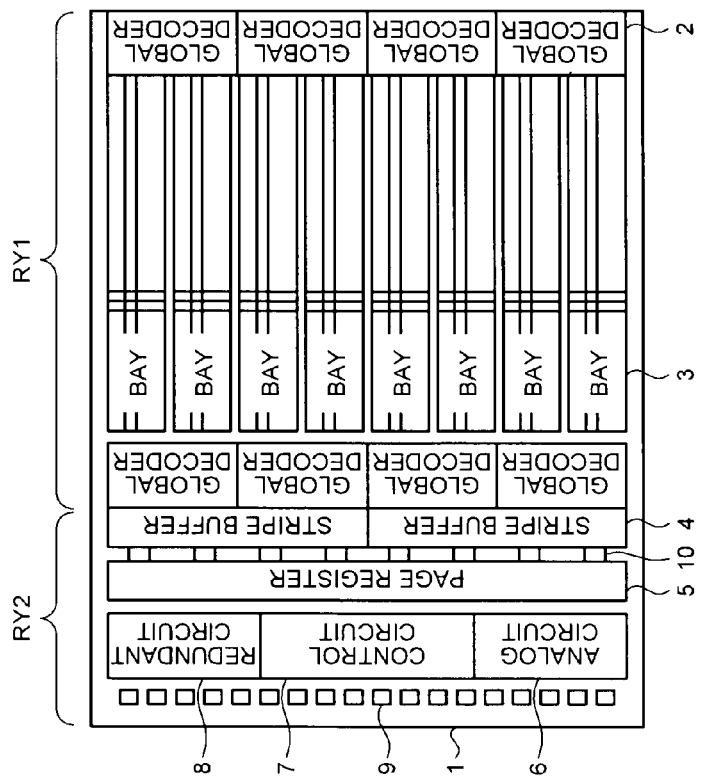
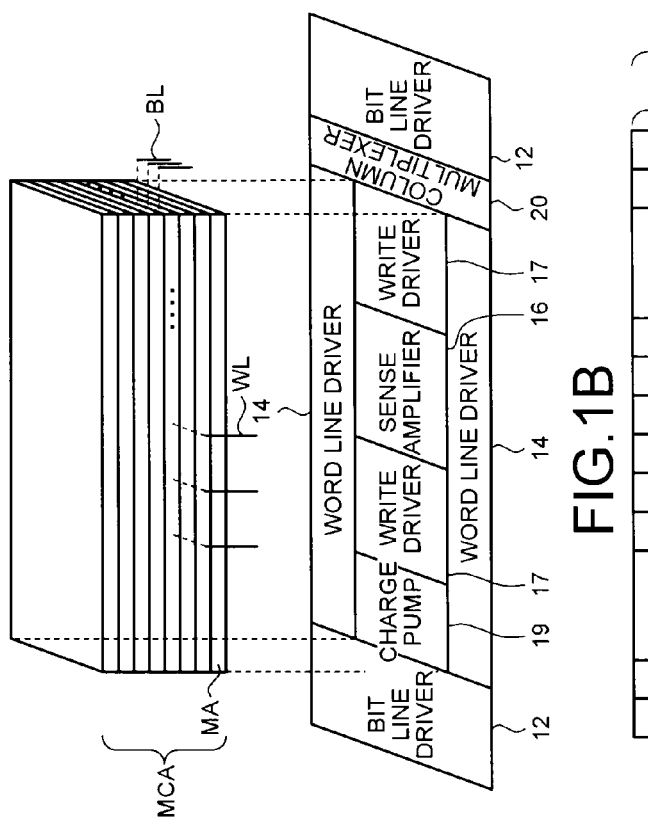
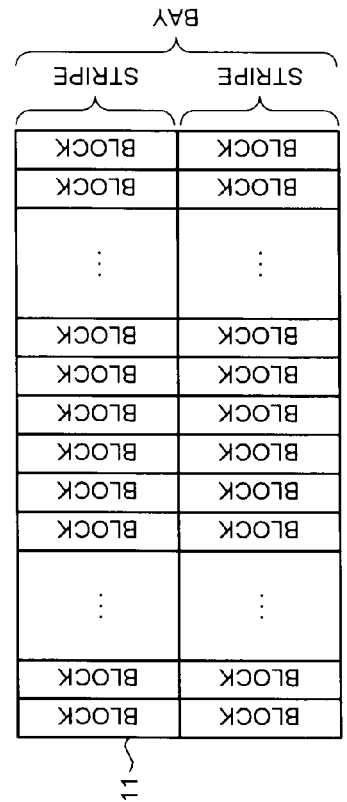

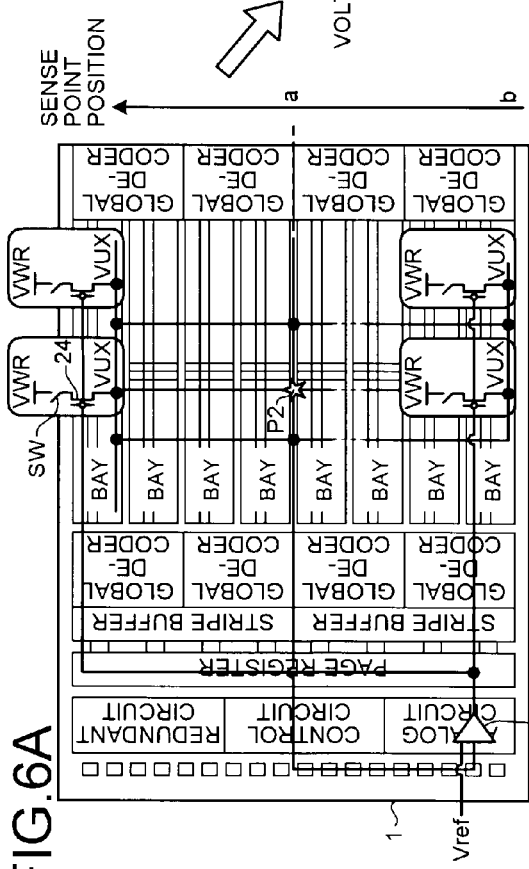
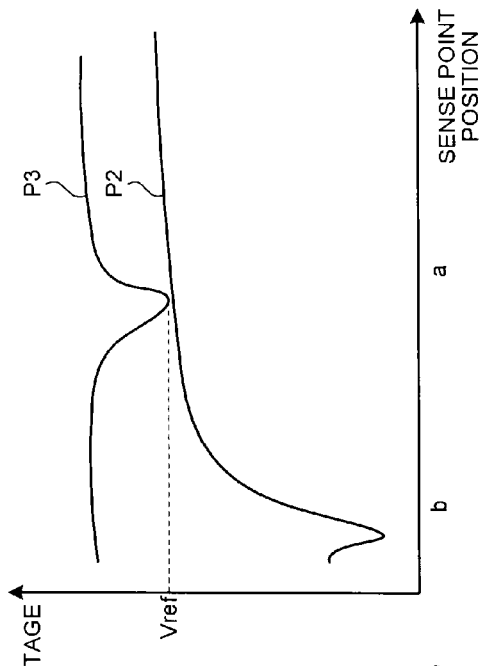
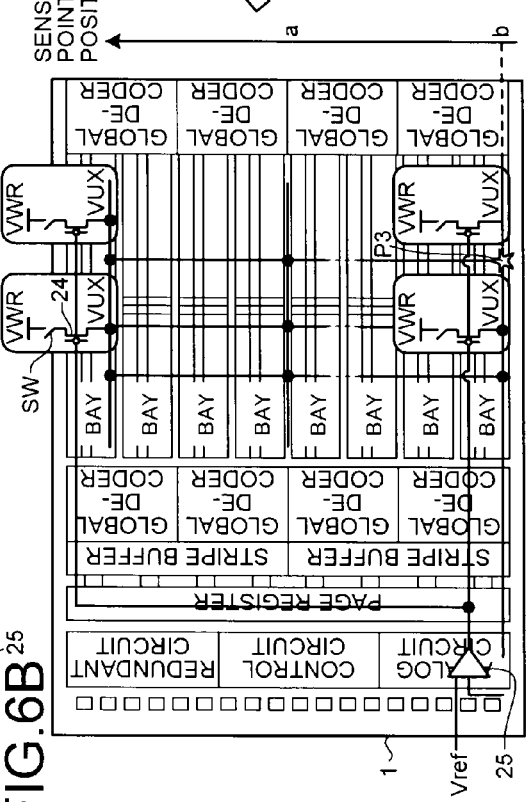
FIG.6A
FIG.6B
FIG.6C

US 8,493,800 B2

THREE DIMENSIONAL SEMICONDUCTOR STORAGE DEVICE HAVING WRITE DRIVERS UNDER A THREE DIMENSIONAL MEMORY CELL ARRAY

CROSS-REFERENCE TO RELATED APPLICATIONS

This application is based upon and claims the benefit of priority from the prior Japanese Patent Application No. 2010-24243, filed on Feb. 5, 2010; the entire contents of which are incorporated herein by reference.

FIELD

Embodiments described herein relate generally to a semiconductor storage device.

BACKGROUND

As a cross-point memory, a NAND flash memory, and the like, a laminated memory attracts attention to attain an increase in a degree of integration without being restricted by a limit in resolution of a lithography technology. In such a laminated memory, in some case, a sense amplifier and a decoder are arranged below a memory cell array to reduce a chip size.

However, in the laminated memory in the past, a driver that drives memory cells is arranged in a peripheral section of the memory cell array. Therefore, when a load on the driver is large, an area of the driver increases to cause an increase in the chip size.

BRIEF DESCRIPTION OF THE DRAWINGS

FIG. 1A is a plan view of a layout configuration of a semiconductor storage device according to an embodiment;

FIG. 1B is a plan view of a layout configuration of a bay shown in FIG. 1A;

FIG. 1C is a perspective view of a layout configuration of blocks shown in FIG. 1B corresponding to an arrangement position of a memory cell array;

FIG. 6A is a plan view of a layout configuration of a semiconductor storage device in which a detection position P2 is set a position of an "a" point;

FIG. 6B is a plan view of a layout configuration of a semiconductor storage device in which a detection position P3 is set in a position of a "b" point; and FIG. 6C is a diagram for explaining position dependency of voltages in the detection positions P2 and P3.

DETAILED DESCRIPTION

Figure 2:
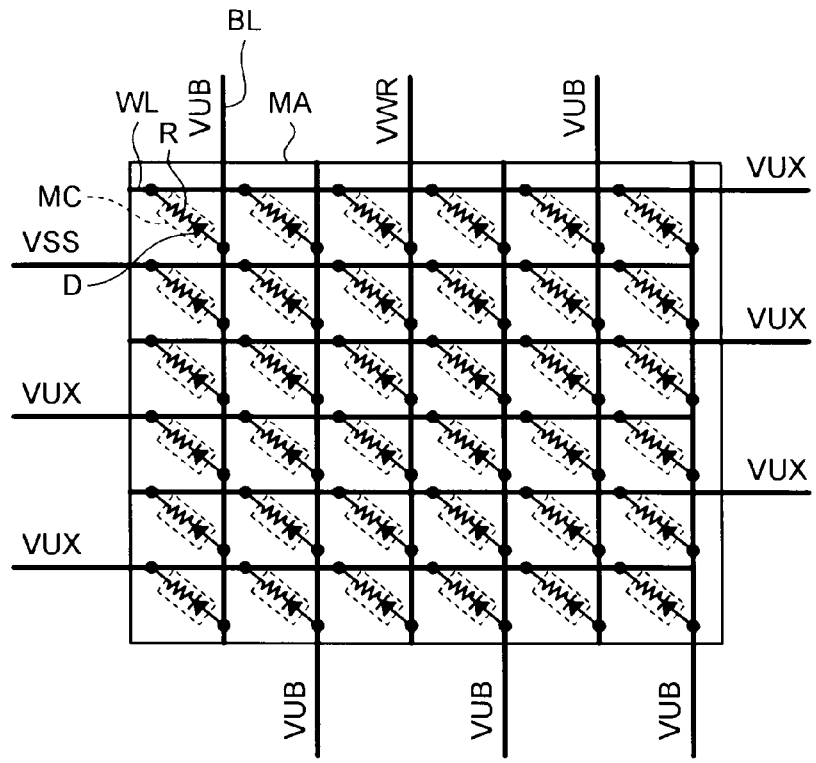
FIG. 2 is a circuit diagram of a schematic configuration of the memory cell array shown in FIG. 1C.

In general, according to one embodiment, a semiconductor storage device includes a three-dimensional memory cell array, write drivers, and a program voltage control circuit. In the three-dimensional memory cell array, memory cells are three-dimensionally arranged. The write drivers are arranged to be distributed under the three-dimensional memory cell array and apply a program voltage to the memory cells during writing in the memory cells. The program voltage control circuit is arranged around the three-dimensional memory cell array and performs control for making the write drivers to generate the program voltage.

Exemplary embodiments of a semiconductor storage device will be explained below in detail with reference to the accompanying drawings. The present invention is not limited to the following embodiments.

FIG. 1A is a plan view of a layout configuration of a semiconductor storage device according to an embodiment. FIG. 1B is a plan view of a layout configuration of a bay shown in FIG. 1A. FIG. 1C is a perspective view of a layout configuration of blocks shown in FIG. 1B corresponding to an arrangement position of a memory cell array.

In FIG. 1A, a cell array region RY1 and a peripheral region RY2 are provided in a semiconductor chip 1. The cell array region RY1 is sectioned for each of bays 3. Global row decoders 2 that perform block selection are arranged on both sides of the bays 3. In an example shown in FIG. 1A, eight bays 3 are provided.

Each of the bays 3 is divided for each of stripes. In each of the stripes, a plurality of blocks 11 are arrayed. In an example shown in FIG. 1B, thirty-two blocks 11 are provided for each of the stripes.

Each of the blocks 11 includes bit line drivers 12 that select bit line BLs, word line drivers 14 that select word line WLs, a sense amplifier 16 that detects, based on a signal read out from memory cells, data stored in the memory cells, write drivers 17 that apply a program voltage VUX to unselected cells during writing in the memory cells, a charge pump circuit 19 that applies a program voltage VWR to selected cells during the writing in the memory cells, and a column multiplexer 20 that extends the sense amplifier 16 to all the bit lines BL.

In the cell array region RY1, a three-dimensional memory cell array MCA is arranged on the semiconductor chip 1. A plurality of memory cell arrays MA are laminated in the three-dimensional memory cell array MCA. In the memory cell arras MA, the word lines WL are formed in a row direction and the bit lines BL are formed in a column direction. In the three-dimensional memory cell array MCA, eight layers of the memory ell arrays MA having 8320 word lines WL and 2176 bit lines BL can be provided for each of the blocks 11.

The blocks 11 are arrayed under the three-dimensional memory cell array MCA. Therefore, the bit line drivers 12, the word line drivers 14, the sense amplifier 16, the write drivers 17, the charge pump circuit 19, and the column multiplexer 20 are arranged to be distributed under the three-dimensional memory cell array MCA.

In the peripheral region RY2, stripe buffers 4 that output row or column signals, a page register 5 that stores, in page unit, data output to the outside, an analog circuit 6 that performs control of the write drivers 17 and the charge pump circuit 19, a control circuit 7 that performs control of changeover switches 10 and the like, a redundant circuit 8 for columns, pad electrodes 9 that perform exchange of signals and power supply with the outside, and the changeover switches 10 that switch a detection position of the program voltage VUX applied by the write drivers 17 are arranged. The control circuit 7 can control the changeover switches 10 based on the positions of selected cells in which writing is performed. For example, the changeover switches 10 can be arranged for the respective bays 3. The changeover switches 10 can be controlled to set a detection position of the program voltage VUX near the bays 3 to be activated.

FIG. 2 is a circuit diagram of a schematic configuration of the memory cell array shown in FIG. 1C.

In FIG. 2, in the memory cell array MA shown in FIG. 1C, memory cells MC are arranged in a matrix shape in a row direction and a column direction. One ends of the memory cells MC in the same row are connected to the same word line WL. The other ends of the memory cells MC in the same column are connected to the same bit line BL.

As the memory cells MC, series circuits of variable resistance elements R and non-ohmic elements D can be used. As the non-ohmic elements D, for example, various diodes such as a schottky diode, a PN junction diode, and a PIN diode, a metal-insulator-metal (MIM) structure, or a silicon-insulator-silicon (SIS) structure can be used. For example, when the PIN diode is used as the non-ohmic elements D, as a material of the non-ohmic elements D, for example, a polysilicon film can be used. When a forward bias is applied to the variable resistance elements R of selected cells, the non-ohmic elements D can prevent, even if a backward bias is applied to unselected cells, the backward bias from being applied to the variable resistance of the unselected cells.

The variable resistance elements R can be formed of, for example, a composite compound having at least two kinds of cation elements. Specifically, the variable resistance element R can be formed of a material having a crystal structure such as a spinel structure ($AM_4O_4$), an ilmenite structure ($AMO_3$), a delafossite structure ($AMO_4$), a $LiMoN_4$ structure ($AMN_4$), a wolframite structure ($AMO_4$), an olivine structure ($A_4MO_4$), a hollandite structure ($AxMO_4$), a ramsdellite structure ($AxMO_4$), or a perovskie structure ($AMO_3$).

Figure 3:
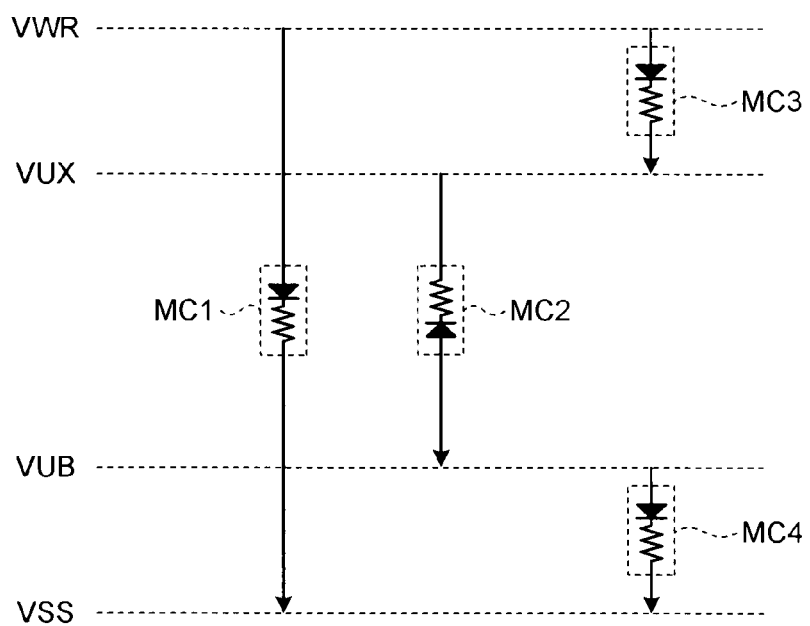
FIG. 3 is a diagram of voltages applied to selected cells and unselected cells during writing in a memory cell.

FIG. 3 is a diagram of voltages applied to a selected cell and an unselected cell during writing in a memory cell.

In FIG. 3, during writing in a memory cell, the write drivers 17 shown in FIG. 1C generate program voltages VUX and VUB and the charge pump circuit 19 shown in FIG. 1C generates a program voltage VWR. A low voltage VSS is applied to the word lines WL selected by the word line drivers 14. The program voltage VUX is applied, via the write drivers 17, to the word lines WL not selected by the word line drivers 14. The program voltage VWR is applied, via the charge pump circuit 19, to the bit lines BL selected by the bit line drivers 12. The program voltage VUB is applied, via the write drivers 17, to the bit lines BL not selected by the bit line drivers 12.

A value of the program voltage VWR can be set larger than a value of the program voltage VUX. The value of the program voltage VUX can be set larger than a value of the program voltage VUB. The value of the program voltage VUB can be set larger than a value of the low voltage VSS. The program voltage VUX can be generated by dropping the program voltage VWR.

As a result, a difference between the program voltage VWR and the low voltage VSS is applied to a selected cell MC1 connected to a selected row and a selected column. Writing in the selected cell MC1 is performed.

On the other hand, a difference between the program voltage VUX and the program voltage VUB is applied to an unselected cell MC2 connected to an unselected row and an unselected column. Writing in the unselected cell MC2 is inhibited.

A difference between the program voltage VWR and the program voltage VUX is applied to an unselected cell MC3 connected to an unselected row and a selected column. Writing in the unselected cell MC3 is inhibited.

A difference between the program voltage VUB and the low voltage VSS is applied to an unselected cell MC4 connected to a selected row and an unselected column. Writing in the unselected cell MC4 is inhibited.

Figure 4:
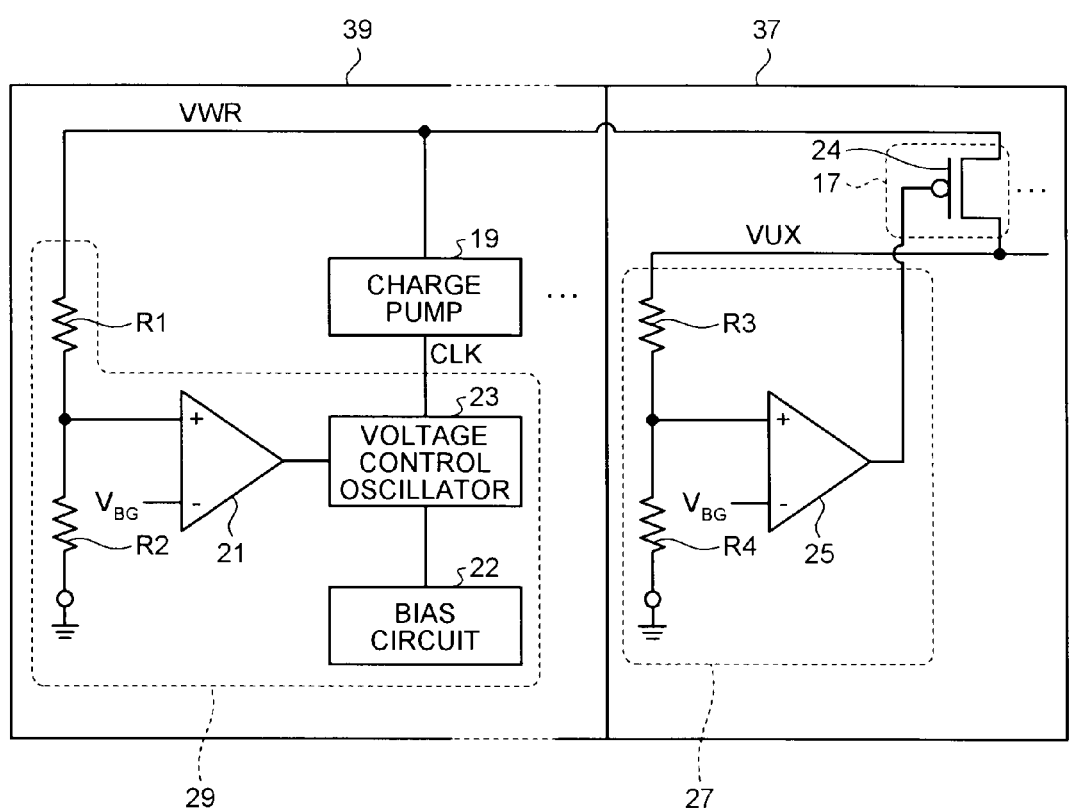
FIG. 4 is a block diagram of a schematic configuration of a program voltage generating circuit that generates program voltages VWR and VUX shown in FIG. 3.

FIG. 4 is a block diagram of a schematic configuration of a program voltage generating circuit that generates the program voltages VWR and VUX shown in FIG. 3.

In FIG. 4, a program voltage generating circuit 39 includes the charge pump circuit 19 and a program voltage control circuit 29. A program voltage generating circuit 37 includes the write driver 17 and a program voltage control circuit 27. The program voltage control circuits 27 and 29 can be provided in the analog circuit 6 shown in FIG. 1A. The charge pump circuit 19 and the write driver 17 can be arranged to be distributed under the three-dimensional memory cell array MCA for each of the blocks 11 shown in FIG. 1C.

The write driver 17 includes a P-channel field effect transistor 24 that generates the program voltage VUX. The program voltage control circuit 29 includes resistors R1 and R2, a comparator 21, a VCO bias circuit 22, and a voltage control oscillator 23. The program voltage control circuit 27 includes resistors R3 and R4 and a comparator 25.

The resistors R1 and R2 are connected in series to each other. A connection point of the resistors R1 and R2 is connected to one input terminal of the comparator 21. An output of the comparator 21 is connected to the voltage control oscillator 23. An output of the voltage control oscillator 23 is connected to the charge pump circuit 19. An output of the charge pump circuit 19 is connected to one input terminal of the comparator 21 via the resistor R1 and connected to a source of the P-channel field effect transistor 24.

The resistors R3 and R4 are connected in series to each other. A connection point of the resistors R3 and R4 is connected to one input terminal of the comparator 25. An output of the comparator 25 is connected to a gate of the P-channel field effect transistor 24. A drain of the P-channel field effect transistor 24 is connected to one input terminal of the comparator 25 via the resistor R3.

The program voltage VWR generated by the charge pump circuit 19 is divided by the resistors R1 and R2. The divided voltage is compared with a bang gap reference voltage $V_{BG}$ by the comparator 21. A result of the comparison is output to the voltage control oscillator 23. A frequency of a clock signal CLK is controlled by the voltage control oscillator 23 according to an output from the voltage control oscillator. The charge pump circuit 19 is driven according to the clock signal CLK. Consequently, the divided voltage of the program voltage VWR is controlled to coincide with the band gap reference voltage $V_{BG}$.

The program voltage VWR generated by the charge pump circuit 19 is supplied to the source of the P-channel field effect transistor 24 and dropped by the P-channel field effect transistor 24. As a result, the program voltage VUX is generated. The program voltage VUX generated by the P-channel field effect transistor 24 is divided by the resistors R3 and R4. The divided voltage is compared with the band gap reference voltage $V_{BG}$ by the comparator 25. A result of the comparison is output to the gate of the P-channel field effect transistor 24. A gate potential of the P-channel field effect transistor 24 is controlled according to the output of the comparator 25. Consequently, the divided voltage of the program voltage VUX is controlled to coincide with the band gap reference voltage $V_{BG}$.

The charge pump circuit 19 and the write drivers 17 are distributed for each of the blocks 11. This makes it possible to arrange the charge pump circuit 19 and the write drivers 17 under the three-dimensional memory cell array MCA while making it possible to arrange the bit line drivers 12, the word line drivers 14, and the sense amplifier 16 under the three-dimensional memory cell array MCA. Therefore, even when an area of drivers for driving the word lines WL and the bit lines BL is large because capacities of the word lines WL and the bit lines BL of the entire three-dimensional memory cell array MCA are large, it is unnecessary to arrange such drivers in the peripheral region RY2. Therefore, it is possible to reduce a chip size.

Figure 5:
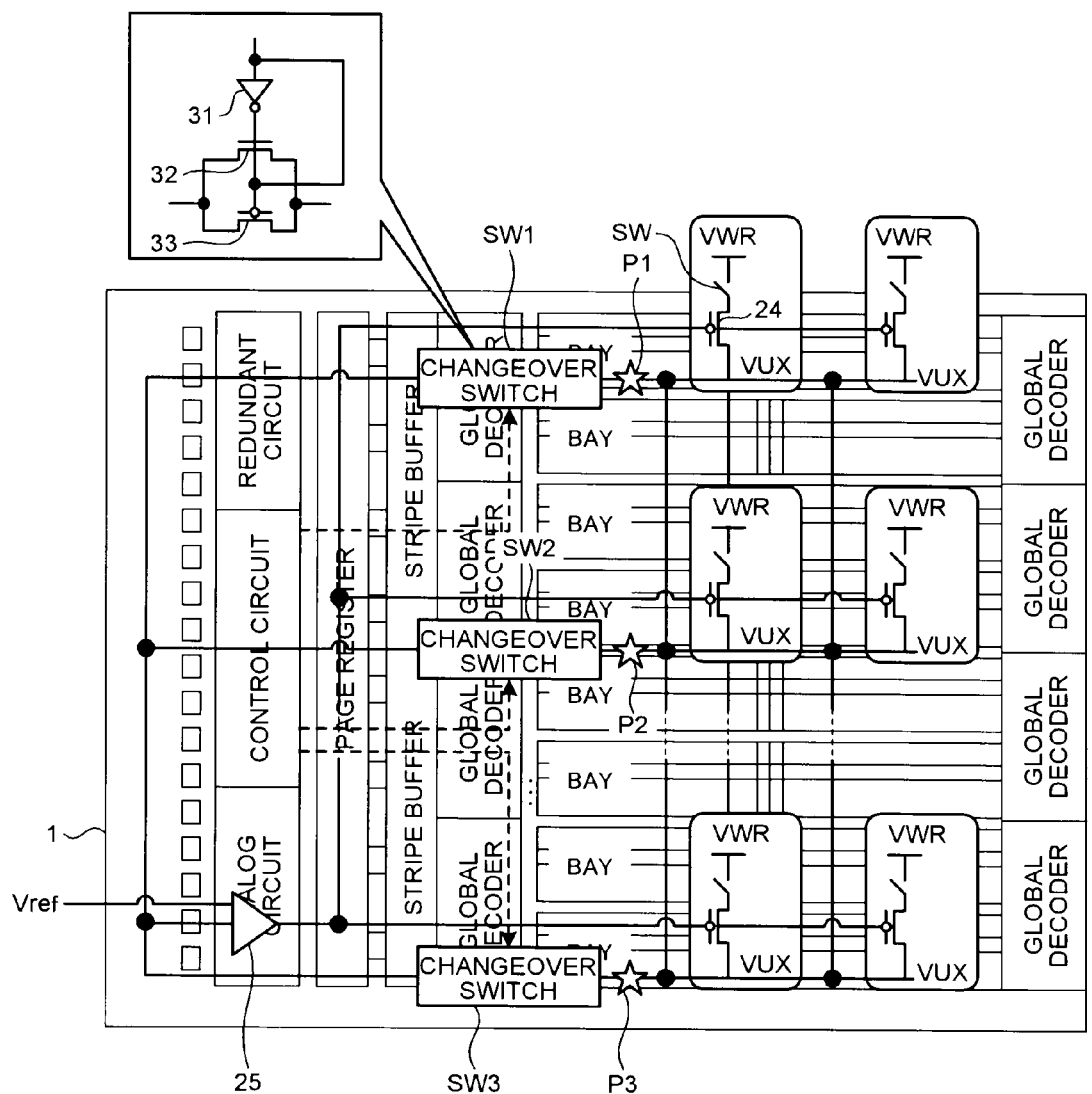
FIG. 5 is a schematic plan view of an arrangement example of changeover switches shown in FIG. 1A.

FIG. 5 is a schematic plan view of an arrangement example of the changeover switches shown in FIG. 1A.

In FIG. 5, changeover switches SW1 to SW3 are provided as the changeover switches 10 shown in FIG. 1A. The changeover switches SW1 to SW3 can be provided for, for example, the respective bays 8. Alternatively, the changeover switches SW1 to SW3 can be provided for the respective stripes or can be provided for the respective blocks 11.

For example, the changeover switch SW1 includes an inverter 31, an N-channel field effect transistor 32, and a P-channel field effect transistor 33 to form a transfer gate.

A plurality of the P-channel field effect transistors 24 that apply the program voltage VUX to the word lines WL are provided for the respective blocks 11. Sources of the P-channel field effect transistors 24 are connected to the output of the charge pump circuit 19 respectively via selection switches SW. The selection switches SW can be provided in the word line drivers 14 shown in FIG. 1C.

Any ones of the bays 8 are activated and write is performed in the memory cells MC included in the activated bays 8. In this case, the changeover switches SW1 to SW3 arranged to correspond to the bays 8 are turned on. Consequently, only the word lines WL near the bays 3 are connected to the comparator 25 and detection positions P1 to P3 for the program voltage VUX are set near the bays 3.

The word lines WL of unselected rows are selected by the selection switches SW. The program voltage VUX is applied to the word lines WL of the unselected rows via the P-channel field effect transistors 24. The program voltage VWR is applied to the word lines WL of selected rows corresponding to the activated bays 8 via the charge pump circuit 19.

The program voltage VUX in the detection positions P1 to P3 respectively set by the changeover switches SW1 to SW3 is divided by the resistors R3 and R4 shown in FIG. 4. The divided voltage is compared with a reference voltage Vref by the comparator 25. As the reference voltage Vref, for example, the band gap reference voltage $V_{BG}$ can be used. A gate potential of the P-channel field effect transistors 24 is controlled according to an output of the comparator 25. Consequently, the divided voltage of the program voltage VUX in the detection positions P1 to P3 is controlled to coincide with the reference voltage Vref.

The detection positions P1 to P3 for the program voltage VUX are switched according to the positions of the memory cells MC in which writing is performed. This makes it possible to, even when the write drivers 17 are arranged to be distributed, compare the program voltage VUX near the memory cells MC in which writing is performed with the reference voltage Vref and improve accuracy of the program voltage VUX.

FIG. 6A is a plan view of a layout configuration of a semiconductor storage device in which the detection position P2 is set in a position of an "a" point. FIG. 6B is a plan view of a layout configuration of a semiconductor storage device in which the detection position P3 is set in a position of a "b" point. FIG. 6C is a diagram for explaining position dependency of voltages in the detection positions P2 and P3.

In FIG. 6A, it is assumed that there is a selected cell for performing writing in the bay 3 present in the lowest position of the "b" point in the cell array region RY1. In this case, a backward bias is applied to unselected cells of the bay 3 present in the position of the "b" point and an off-leak current flows. Therefore, the bay 3 acts as a current source and a voltage drop occurs. For example, if an off-leak current of 40 picoamperes flows to one memory cell MC, for example, in unit of the block 11 (e.g., 4K×8K), an off-leak current of 1.2 milleamperes flows and a relatively large voltage drop occurs.

If the detection position P2 is set in the position of the "a" in the center of the cell array RY1, even when the program voltage VUX drops following the current source of the bay 3 present in the position of the "b" point, the program voltage VUX before the drop is compared with the reference voltage Vref by the comparator 25. Therefore, as indicated by P2 in FIG. 6C, the program voltage VUX of the bay 3 present in the position of the "b" point is lower than the reference voltage Vref. It is likely that a writing error occurs.

On the other hand, in FIG. 6B, if the detection point P3 is set in the lowest position of the "b" point of the cell array region RY1, even when the program voltage VUX drops following the current source of the bay 3 present in the position of the "b" point, the program voltage VUX after the drop can be compared with the reference voltage Vref by the comparator 25. Therefore, as indicated by P3 in FIG. 6C, the program voltage VUX of the bay 3 present in the position of the "b" point can be set the same as the reference voltage Vref. It is possible to prevent a writing error.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a three-dimensional memory cell array in which memory cells are three-dimensionally arranged;
   write drivers arranged to be distributed under the three-dimensional memory cell array and configured to apply a first program voltage to the memory cells during writing in the memory cells;
   a first program voltage control circuit arranged around the three-dimensional memory cell array and configured to perform control for making the write drivers to generate the first program voltage;
   charge pump circuits arranged to be distributed under the three-dimensional memory cell array and configured to apply a second program voltage to the selected cell during the writing in the memory cells; and
   a second program voltage control circuit arranged around the three-dimensional memory cell array and configured to perform control for making the charge pump circuits to generate the second program voltage, wherein
   the first program voltage is applied to an unselected cell during writing in a selected cell, and wherein
   the write drivers drop the second program voltage to thereby generate the first program voltage.

2. The semiconductor storage device according to claim 1, wherein the write drivers include field effect transistors configured to drop the second program voltage.

3. A semiconductor storage device comprising:
   a three-dimensional memory cell array in which memory cells are three-dimensionally arranged;

write drivers arranged to be distributed under the three-dimensional memory cell array and configured to apply a first program voltage to the memory cells during writing in the memory cells; and a first program voltage control circuit arranged around the three-dimensional memory cell array and configured to perform control for making the write drivers to generate the first program voltage wherein the first program voltage control circuit includes a comparator configured to compare the first program voltage applied by the write drivers with a reference voltage, and the first program voltage control circuit controls the write drivers based on an output of the comparator.

4. The semiconductor storage device according to claim 3, further comprising a changeover switch configured to switch a detection position of the first program voltage compared by the comparator.

5. The semiconductor storage device according to claim 4, wherein the changeover switch is a transfer gate.

6. The semiconductor storage device according to claim 4, further comprising a control circuit configured to control the changeover switch based on a position of a selected cell in which writing is performed.

7. The semiconductor storage device according to claim 6, wherein the control circuit controls the changeover switch for each of bays that section the three-dimensional memory array.

8. The semiconductor storage device according to claim 7, wherein the control circuit controls the changeover switch to set the detection position of the first program voltage near an activated bay.

9. The semiconductor storage device according to claim 1, wherein
  a lower layer of the three-dimensional memory cell array is sectioned into a plurality of blocks, and
  the write drivers are arranged in the respective blocks.

10. The semiconductor storage device according to claim 1, wherein the second program voltage control circuit includes:
  a comparator configured to compare the second program voltage generated by the charge pump circuit with a reference voltage; and
  a voltage control oscillator configured to control, based on an output of the comparator, a frequency of a clock signal for driving the charge pump circuit.

* * * * *